United States Patent
Wang et al.

(10) Patent No.: US 6,968,889 B2
(45) Date of Patent: Nov. 29, 2005

(54) FASTENING STRUCTURE OF HEAT SINK

(75) Inventors: Jack Wang, No. 2-3, Hsing-Hua Rd., Taoyuan City 330 (TW); Cheng-Hua Cheng, Taoyuan (TW); Michael Lin, Taoyuan (TW); Charles Ma, Taoyuan (TW)

(73) Assignees: Waffer Technology Corp., Taoyuan; Jack Wang, Taoyuan ( * ) Notice: Subject to any disclaimer, the term of this patent is extended or adjusted under 35 U.S.C. 154(b) by 0 days.

(21) Appl. No.: 10/717,450

(22) Filed: Nov. 21, 2003

(65) Prior Publication Data

US 2005/0109488 A1    May 26, 2005

(51) Int. Cl.$^7$ ................................................. F28F 7/00
(52) U.S. Cl. ...................... 165/80.1; 165/80.3; 165/185
(58) Field of Search .............................. 165/80.1–80.5, 165/185; 361/702, 703

(56) References Cited

U.S. PATENT DOCUMENTS

| | | | |
|---|---|---|---|
| 5,710,694 A * | 1/1998 | Chen .......................... | 165/80.3 |
| 6,212,074 B1 * | 4/2001 | Gonsalves et al. .......... | 165/80.3 |
| 6,370,024 B1 * | 4/2002 | Lo .............................. | 165/80.2 |
| 6,382,306 B1 * | 5/2002 | Hsu ........................... | 165/80.3 |
| 6,396,696 B1 * | 5/2002 | Lin et al. .................... | 165/185 |
| 6,401,807 B1 * | 6/2002 | Wyler et al. ................ | 165/185 |
| 6,507,981 B1 * | 1/2003 | Bosak et al. ............... | 165/80.3 |
| 6,549,410 B1 * | 4/2003 | Cohen ........................ | 165/80.3 |
| 6,625,021 B1 * | 9/2003 | Lofland et al. ............. | 165/80.3 |
| 6,788,539 B2 * | 9/2004 | Skofljanec .................. | 165/185 |
| 2002/0060064 A1 * | 5/2002 | Yu .............................. | 165/80.3 |
| 2003/0209342 A1 * | 11/2003 | Hsin et al. .................. | 165/80.3 |

* cited by examiner

Primary Examiner—Teresa J. Walberg

(57) ABSTRACT

A heat dissipating device includes a fastening structure and a heat sink. The heat sink has a thermal conductive base which has a top surface and two T-shape slots formed at two opposing ends of the top surface. The fastening structure has a pair of brackets. Each of the brackets has a planar plate and a T-shape arm to be inserted into the corresponding T-shape slot. The T-shape arms are hinged with one end of the planar plates, such that when the T-shape arms are inserted into the T-shape slots, the planar plates extend horizontally at a level lower than the top surface of the base. Each of the planar plates has a through hole through which the fastening structure can be mounted to a board by a fastener.

8 Claims, 9 Drawing Sheets

FASTENING STRUCTURE OF HEAT SINK

BACKGROUND OF THE INVENTION

The present invention relates to a fastening structure of a heat sink, and more particular, to a structure to prevent loose or displacement of a heat sink.

As the operation speed of the electronic devices such as computer, personal data assistance becomes faster and faster, the internal temperature of the electronic devices increases higher and higher. To effectively dissipate heat generated in the electronic devices and maintain various components of the electronic devices operating under tolerable temperatures, heat sinks or heat dissipating devices have become necessary devices for current electronic devices. Normally, heat sinks are mounted to the heat generating devices such as chip or central processing unit on a motherboard of the electronic devices by fastening structures. By stably mounting the heat sinks, heat generated by the electronic devices can be efficiently dissipated, and the electronic devices can operate normally.

However, when the electronic devices loosen or displace from the desired position, the assembly of the electronic devices becomes difficult, and the heat dissipation of the electronic devices is problematic. Further, for different types of heat sinks, a great variety of fastening structures and methods have been used. Currently, no standard designs of fastening structures have been developed. The application flexibility is thus very limited.

BRIEF SUMMARY OF THE INVENTION

The present invention provides a heat dissipating device which comprises a fastening structure and a heat sink. The fastening structure securely mounts the heat sink to a heat generating device formed on a board, such that the heat sink is prevented from loosening or displacing away from the heat generating device.

The heat sink includes a thermal conductive base and a fastening structure. The thermal conductive base has a top surface and two T-shape slots formed at two opposing ends of the top surface. The fastening structure includes a pair of brackets. Each of the brackets includes a planar plate and a T-shape arm to be inserted into the corresponding T-shape slot. The T-shape arms are hinged with one ends of the planar plates, such that when the T-shape arms are inserted into the T-shape slots, the planar plates extend horizontally at a level lower than the top surface of the base. Each of the planar plates has a through hole through which the fastening structure can be mounted to a board by a fastener. Preferably, the heat sink further comprises a plurality of fins mounted to the top surface of the base. Each of the fins has a notch recessed from a bottom edge thereof. The base preferably has a cross section conformal to the notches of the fins, such that the top portion of the base can be received in the channel formed by the notches.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These, as well as other features of the present invention, will become apparent upon reference to the drawings wherein.

DETAILED DESCRIPTION OF THE INVENTION

Figure 1:
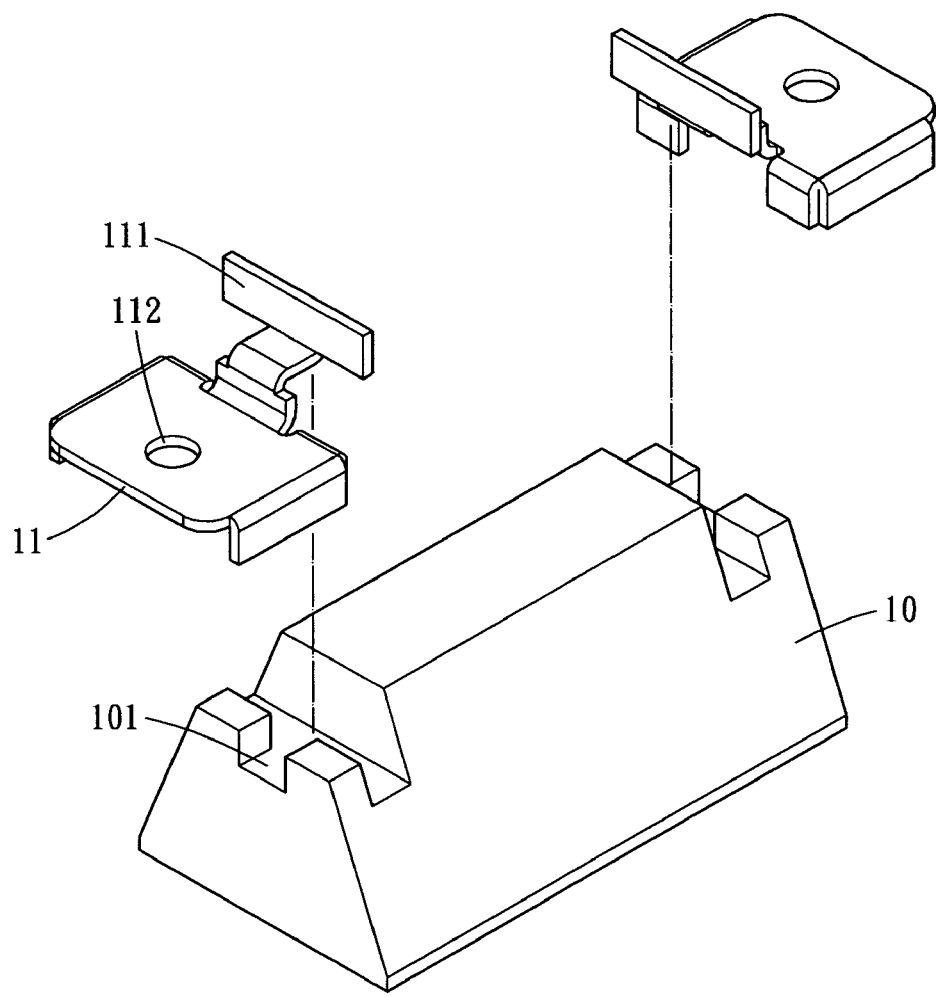
FIG. 1 shows an exploded view of a fastening structure of a heat sink provided by the present invention.

Reference will now be made in detail to the preferred embodiments of the present invention, examples of which are illustrated in the accompanying drawings. Wherever possible, the same reference numbers are used in the drawings and the description to refer to the same or like parts.

Figure 2:
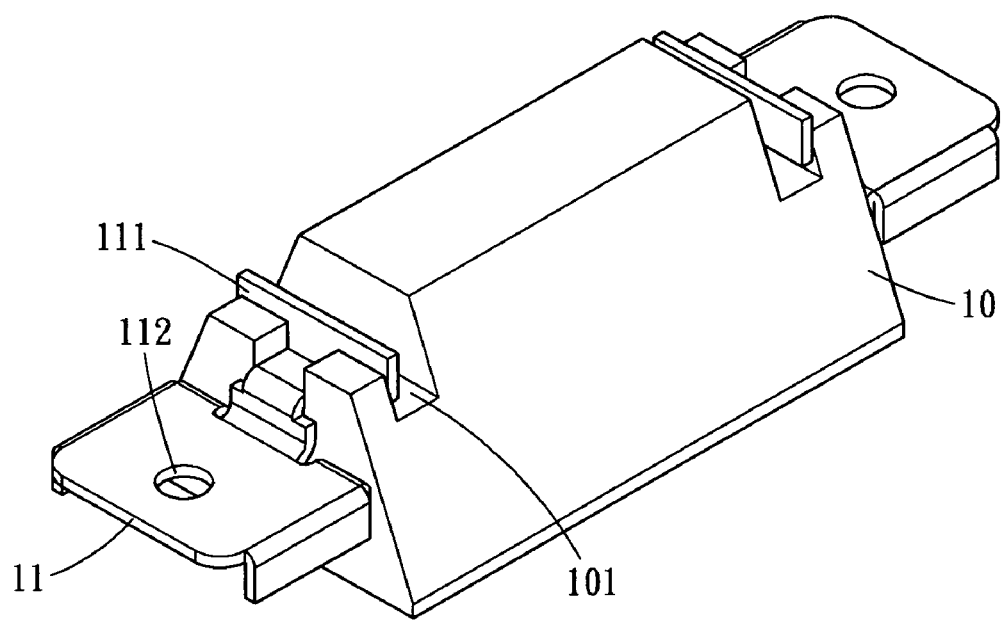
FIG. 2 shows a perspective view of the assembly of the fastening structure as shown in FIG. 1.
Figure 3:
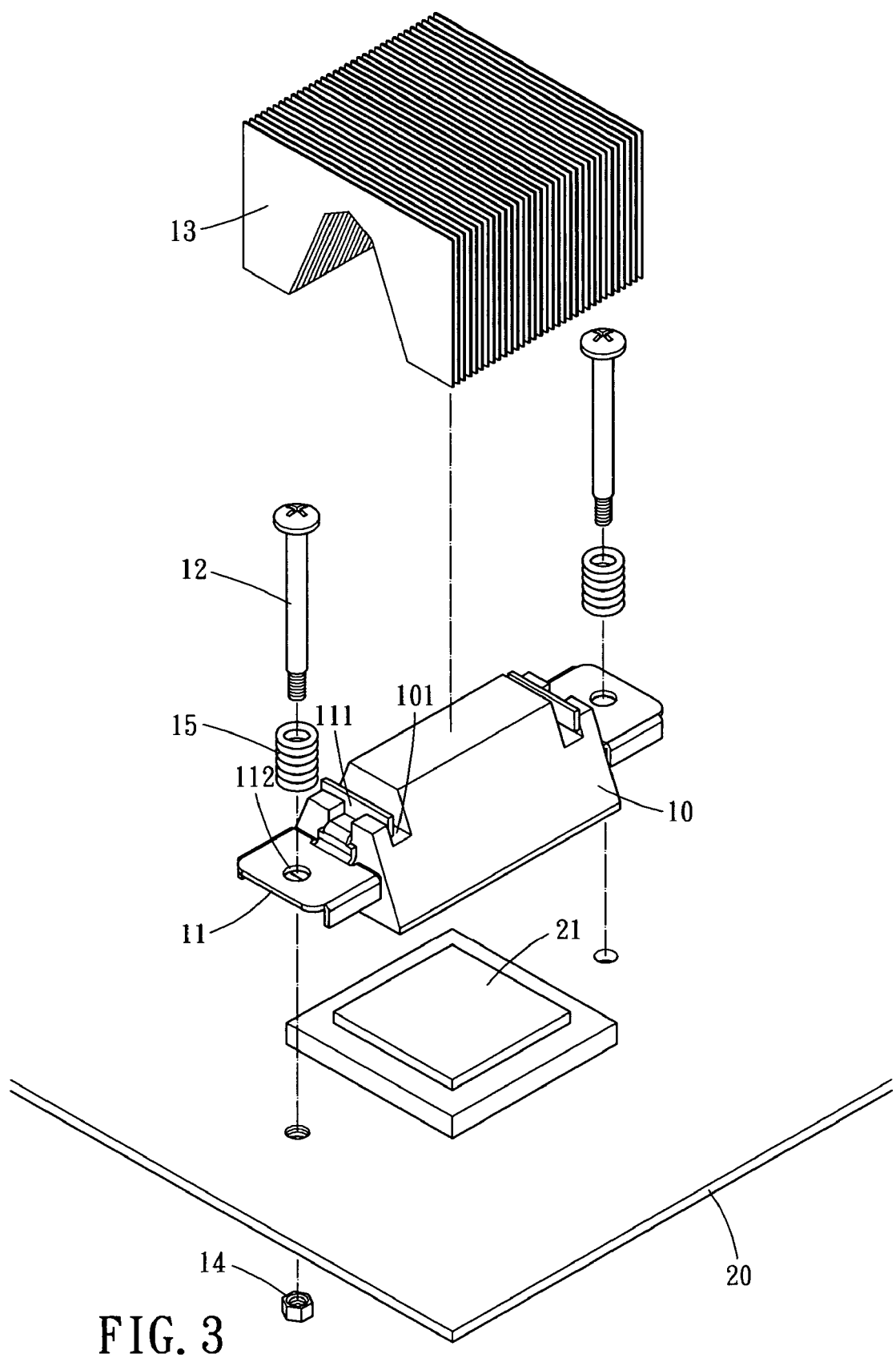
FIG. 3 shows an exploded view of applying the fastening structure as shown in FIG. 1 to a heat sink.

FIGS. 1 to 6 show a fastening structure 11 for securing a heat dissipating device to a heat generating device. As shown in FIG. 3, the heat dissipating device includes a plurality of fins 13 arranged in parallel on a thermal conductive base 10. The fins 13 are spaced from each other by a gap. In this embodiment, the fins 13 extend along a vertical direction and each of the fins 13 includes a triangular or trapezoid notch recessed from a bottom edge thereof. As a result, the heat sink 10 includes a through channel recessed from a bottom surface thereof. As shown, the channel has a triangular or trapezoid cross section, and the base has a cross section conformal to the cross section of the channel, such that the base 10 can be received within the channel. To apply the heat dissipating device to a heat generating device 21 formed on a motherboard 20, a thermal conductive paste is apply to the bottom surface of the base 10 and/or the top surface of the heat generating device 21, and the heat dissipating device is mounted on the top surface of the heat generating device 21 via the paste.

Figure 4:
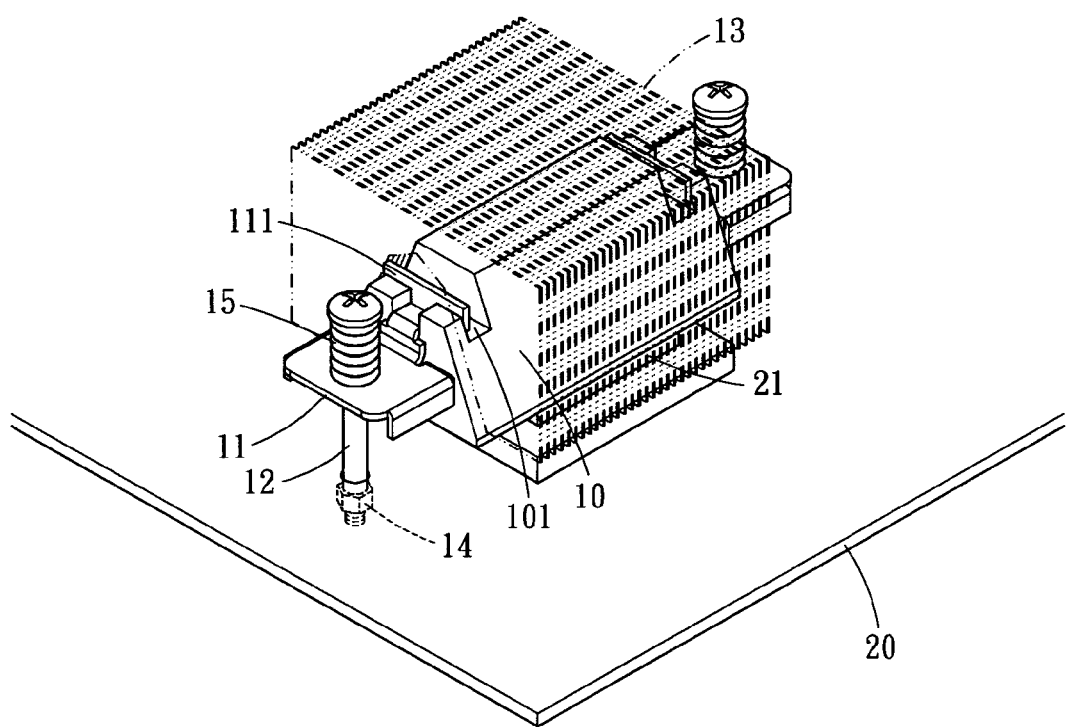
FIG. 4 shows a perspective view of the application as shown in FIG. 3.
Figure 5:
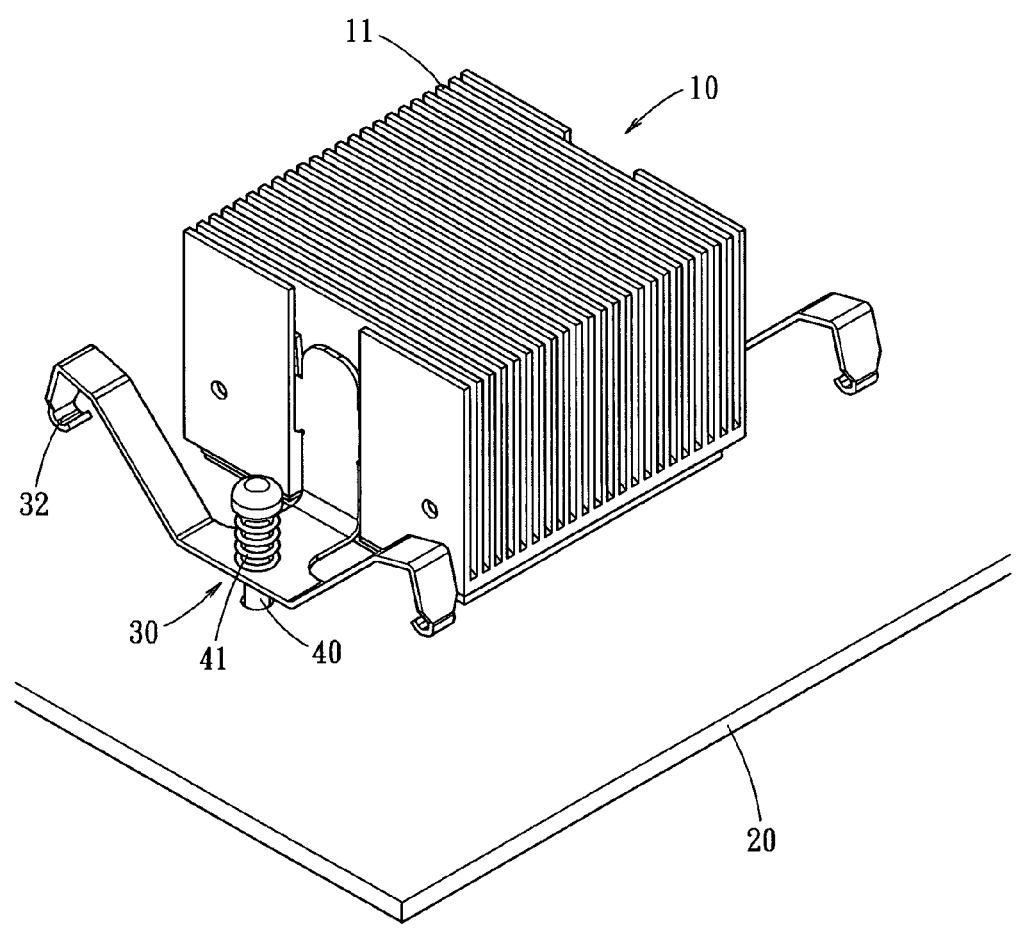
FIG. 5 shows a perspective view of the application of a fastening structure in another embodiment of the present invention.
Figure 6:
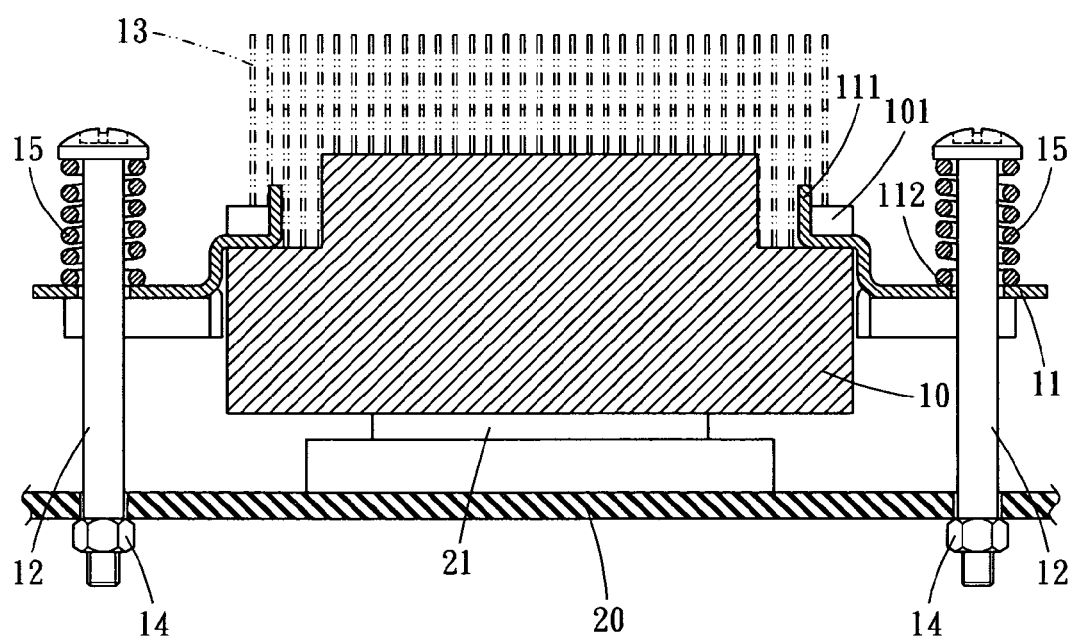
FIG. 6 shows a side view of the application as shown in FIG. 5.

As shown in FIG. 1, two lateral sides of the top surface of the base 10 are recessed to form T-shape slots 101, and the fastening structure 11 includes a pair of brackets to be engaged with the base 10 at the slots 101. As shown in FIG. 1, each bracket includes a planar plate and a T-shape locking member 111 hinged at one side of the planar plate. The T-shape locking members 111 are inserted into the T-shape slots 101 as shown in FIG. 2, leaving the planar plate suspended at a level lower than the top surface of the base 10. Each of the planar plates includes a through hole 112. By forming a threaded hole in the motherboard 20 at the corresponding position, the planar plate can be mounted and secured to the motherboard 20 threading a screw 12 through the through hole of the plate into the threaded hole. Preferably, a resilient member 15 such as a spring is applied between the head of the screw 12 and the planar plate. To further ensure the engagement between the planar plates of the bracket and the motherboard 20, a screw nut 14 is applied at the bottom surface of the motherboard as shown in FIG. 4. In this manner, the heat dissipating device can be easily attached to or detached from the heat generating device 21.

Figure 7:
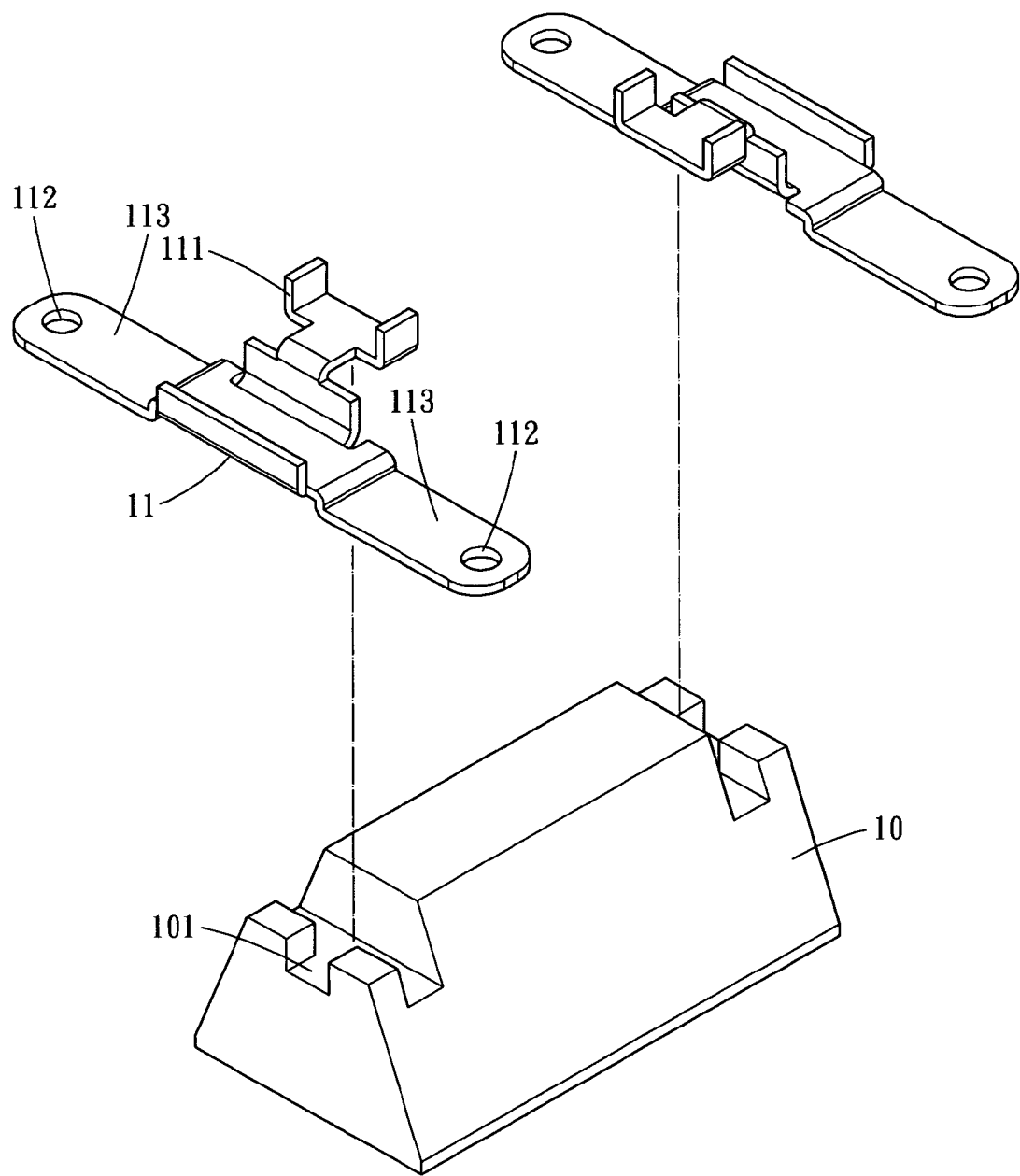
FIG. 7 shows an exploded view of a fastening structure in another embodiment of the present invention.
Figure 8:
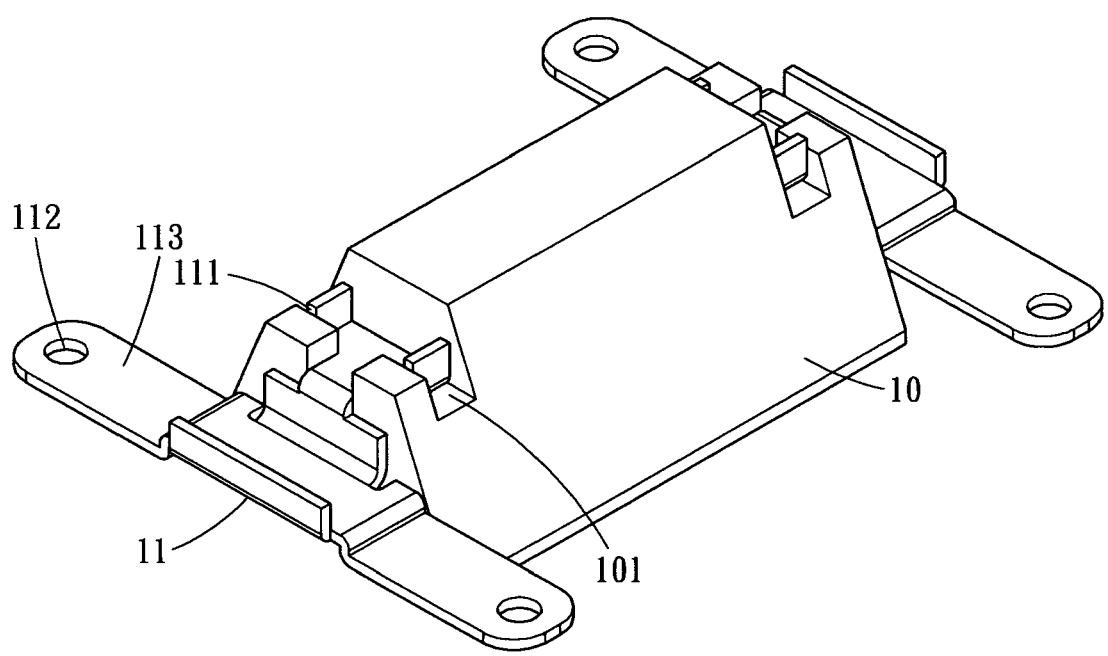
FIG. 8 shows a perspective view of the assembly of the fastening structure as shown in FIG. 7.
Figure 9:
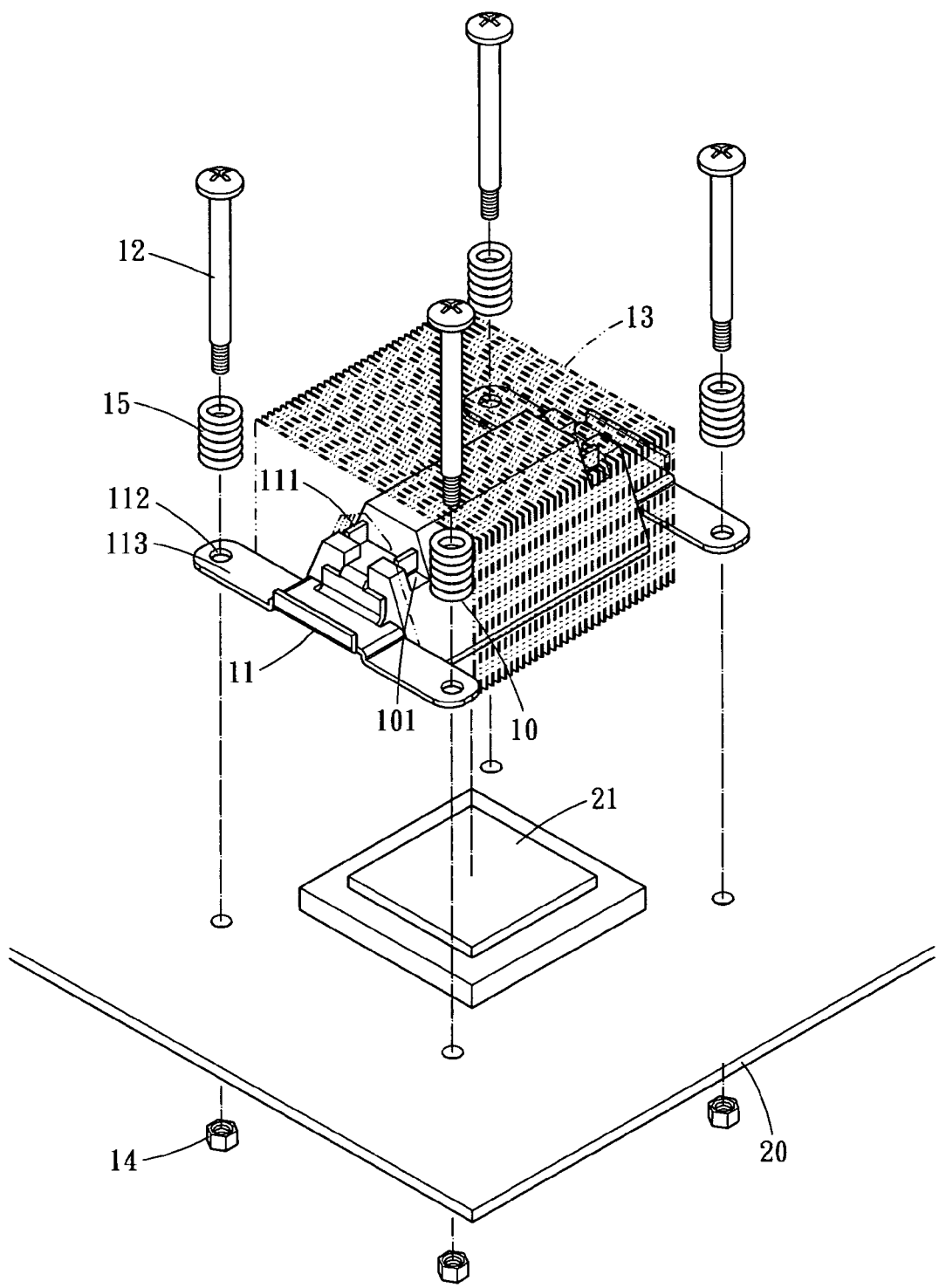
FIG. 9 shows a perspective view of the fastening structure as shown in FIG. 8 applied to a heat sink.

FIGS. 7–9 show a modification of the embodiment as mentioned above. In the embodiment as shown in FIGS. 7–9, the bracket includes the T-shape arms 111 to be disposed in the T-shape slots 101 and an elongate plate extending perpendicular to the base 10. The T-shape arms 111 are hinged with the elongate plates. Therefore, when the T-shape arms 111 are engaged with the base 10 at the slots 101, the elongate plates extend horizontally at a level lower than the top surface of the base 10. At two opposing ends of the elongate plates, two through holes 112 are formed allowing fasteners such as screw and screw nut to fasten the elongate plates to the motherboard 20.

The fastening structure provided by the present invention has at least the following advantages.

1. The heat sink is prevented from loosening or displacing away from the heat generating device.
2. The fastening structure can be easily attached to and detached from the heat sink.
3. The fastening structure can be applied to heat sinks with various configurations.

This disclosure provides exemplary embodiments of the present invention. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed is:

1. A heat dissipating device, comprising:
   a heat sink, comprising a base having a top surface and two T-shape slots formed at two opposing ends of the top surface; and
   a fastening structure, comprising a pair of brackets to be engaged with the base at the T-shape slots, wherein each of the brackets includes:
   a planar plate having at least one through hole formed therein; and
   a T-shape arm hinged with one end of the planar plate, wherein when the T-shape arm is inserted into the T-shape slot, the planar plate extending horizontally at a level lower than the top surface of the base.

2. The heat dissipating structure of claim 1, wherein heat sink further comprising a plurality of fins mounted to the top surface of the base.

3. The heat dissipating device of claim 2, wherein each of the fins has a notch at a bottom edge thereof, the notch is conformal to a cross section of the base.

4. The heat dissipating device of claim 1, further comprising a pair of fasteners for fastening the heat sink to a board through the through holes of the planar plate.

5. The heat dissipating device of claim 4, wherein each fastener includes a screw and a screw nut.

6. The heat dissipating device of claim 5, wherein each fastener further comprises a resilient member disposed between a head of the screw and the planar plate.

7. The heat dissipating device of claim 6, wherein the resilient member comprises a spring.

8. The heat dissipating device of claim 1, wherein each planar plate comprises two through holes formed therein.

\* \* \* \* \*